United States Patent
Margalith et al.

(10) Patent No.: US 7,977,132 B2
(45) Date of Patent: Jul. 12, 2011

(54) EXTENSION OF CONTACT PADS TO THE DIE EDGE VIA ELECTRICAL ISOLATION

(75) Inventors: Tal Margalith, Pleasanton, CA (US); Stefano Schiaffino, Pleasanton, CA (US); Henry Kwong-Hin Choy, Sunnyvale, CA (US)

(73) Assignees: Koninklijke Philips Electronics N.V., Eindhoven (NL); Philps Lumileds Lighting Company, LLC, San Jose, CA (US)

( * ) Notice: Subject to any disclaimer, the term of this patent is extended or adjusted under 35 U.S.C. 154(b) by 160 days.

(21) Appl. No.: 12/436,442

(22) Filed: May 6, 2009

(65) Prior Publication Data
US 2010/0283080 A1     Nov. 11, 2010

(51) Int. Cl.
*H01L 21/00* (2006.01)

(52) U.S. Cl. ............... 438/42; 438/33; 438/403; 257/99; 257/E33.06; 257/E33.065; 257/E21.159; 257/E21.599

(58) Field of Classification Search ............ 257/99, 257/E33.06, E33.065, E21.159, E21.599; 438/42, 33, 403
See application file for complete search history.

(56) References Cited

U.S. PATENT DOCUMENTS

| | | | |
|---|---|---|---|
| 6,828,596 B2 | 12/2004 | Steigerwald et al. | |
| 2004/0061123 A1 | 4/2004 | Shelton et al. | |
| 2005/0211989 A1 * | 9/2005 | Horio et al. | 257/79 |
| 2006/0273339 A1 | 12/2006 | Steigerwald et al. | |
| 2007/0096130 A1 | 5/2007 | Schiaffino et al. | |
| 2007/0262338 A1 | 11/2007 | Higashi et al. | |
| 2008/0179602 A1 * | 7/2008 | Negley et al. | 257/88 |

FOREIGN PATENT DOCUMENTS

| | | |
|---|---|---|
| DE | 102007019775 A1 | 10/2008 |
| DE | 102007046743 A1 | 2/2009 |
| EP | 1953838 A2 | 8/2008 |
| EP | 1956663 A1 | 8/2008 |
| WO | 2007072967 A1 | 6/2007 |

OTHER PUBLICATIONS

Philips Lumileds U.S. Appl. No. 12/266,162, filed Nov. 6, 2008; Entitled: Series Connected Flip Chip LEDS With Growth Substrate Removed.

* cited by examiner

*Primary Examiner* — Tu-Tu V Ho

(57) ABSTRACT

Light emitting diode (LED) dies are fabricated by forming LED layers including a first conductivity type layer, a light-emitting layer, and a second conductivity type layer. Trenches are formed in the LED layers that reach at least partially into the first conductivity type layer. Electrically insulation regions are formed in or next to at least portions of the first conductivity type layer along the die edges. A first conductivity bond pad layer is formed to electrically contact the first conductivity type layer and extend over the singulation streets between the LED dies. A second conductivity bond pad layer is formed to electrically contact the second conductivity type layer, and extend over the singulation streets between the LED dies and the electrically insulated portions of the first conductivity type layer. The LED dies are mounted to submounts and the LED dies are singulated along the singulation streets between the LED dies.

16 Claims, 7 Drawing Sheets

EXTENSION OF CONTACT PADS TO THE DIE EDGE VIA ELECTRICAL ISOLATION

CROSS REFERENCE TO RELATED APPLICATION

This application is related to U.S. patent application Ser. No. 11/611,775, entitled "LED Assembly Having Maximum Metal Support for Laser Lift-off of Growth Substrate," filed on Dec. 15, 2006, which is commonly assigned and incorporated herein by reference.

FIELD OF INVENTION

The present disclosure relates to light-emitting diodes (LEDs) and, in particular, to flip chip LEDs.

DESCRIPTION OF RELATED ART

Semiconductor LEDs are among the most efficient light sources currently available. Materials systems currently of interest in the manufacture of high-brightness light emitting devices capable of operation across the visible spectrum include Group III-V semiconductors; for example, binary, ternary, and quaternary alloys of gallium, aluminum, indium, nitrogen, phosphorus, and arsenic. III-V devices emit light across the visible spectrum. GaAs- and GaP-based devices are often used to emit light at longer wavelengths such as yellow through red, while III-nitride devices are often used to emit light at shorter wavelengths such as near-UV through green.

Gallium nitride LEDs typically use a transparent sapphire growth substrate due to the crystal structure of sapphire being similar to the crystal structure of gallium nitride.

Some GaN LEDs are formed as flip chips, with both electrodes on the same surface, where the LED electrodes are bonded to electrodes on a submount without using wire bonds. In such a case, light is transmitted through the transparent sapphire substrate, and the LED layers oppose the submount. A submount provides an interface between the LED and an external power supply. Electrodes on the submount bonded to the LED electrodes may extend beyond the LED or extend to the opposite side of the submount for wire bonding or surface mounting to a circuit board.

SUMMARY

In some embodiments of the present disclosure, an LED die includes a bond pad and an underlying epitaxial layer of the opposite polarity. The bond pad is extended to the die edge and the epitaxial layer is electrically insulated at the die edge to prevent a short circuit when the bond pad deforms into the epitaxial layer during die singulation. The epitaxial layer may be electrically insulated through ion implantation of the epitaxial layer or resistive epitaxial growth at the die edge. Alternatively, the epitaxial layer may be electrically insulated by providing a dielectric laterally adjacent to the epitaxial layer at the die edge and below the bond pad.

BRIEF DESCRIPTION OF THE DRAWINGS

Use of the same reference numbers in different figures indicates similar or identical elements.

DETAILED DESCRIPTION

Very Large Area interconnects (e.g., bonding pads) with >85% surface coverage have been shown to dramatically decrease the thermal resistance of the light-emitting diode (LED) die/submount construct, and to enable underfill-free support of the epitaxial and the metal layers during Thin Film Flip Chip (TFFC) processing. The former enables LED to be driven at higher currents or temperatures, while the latter serves as both a cost-reduction and a potentially more stable process that is independent of yield/reliability fluctuations resulting from the underfill epoxy material selection, dispense, cure, and removal.

In order to serve as support for the epitaxy in the TFFC processing, the bond pad metal is extended to the edge of the die and into the singulation "streets" on the wafers so the epitaxial and the metal layers are singulated at the same time. The epitaxial layer exposed at the die edge for edge contact may be either n-type or p-type. For an exposed n-type epitaxial layer, any p-type bond pad metal should not be extended to the die edge in order to avoid a p-n short with the underlying n-type epitaxial layer. The p-n short may occur during singulation if the p-type bond pad metal is scribed and deformed into the underlying n-type epitaxial layer. The reverse is true for an exposed p-type epitaxial layer and any n-type bond pad metal extended to the die edge.

The above limits the LED die to one or more centrally located p-type bond pads, which then restricts the LED submount to one with either through-vias or on-submount redistribution that can access the centrally located p-type bond pads. On-submount redistribution is currently only available in silicon submounts while through-via technology with adequately small features is either expensive or unavailable for widely used ceramic submounts. In general, the ability to extend bond pad of either polarity to the die edge enables simplified submount layouts, typically translating to cost reduction.

Embodiments of the present disclosure create electrically insulating regions in or next to an exposed epitaxial layer at the die edge in order to allow for bond pads of the opposite polarity to be extended to the die edge. This enables both increased support for the epitaxial structure during TFFC processing and a simplified interconnect layout on both the LED die and the LED submount, which translate into a greater availability of submount materials and a potential for a cost reduction.

Figure 1:
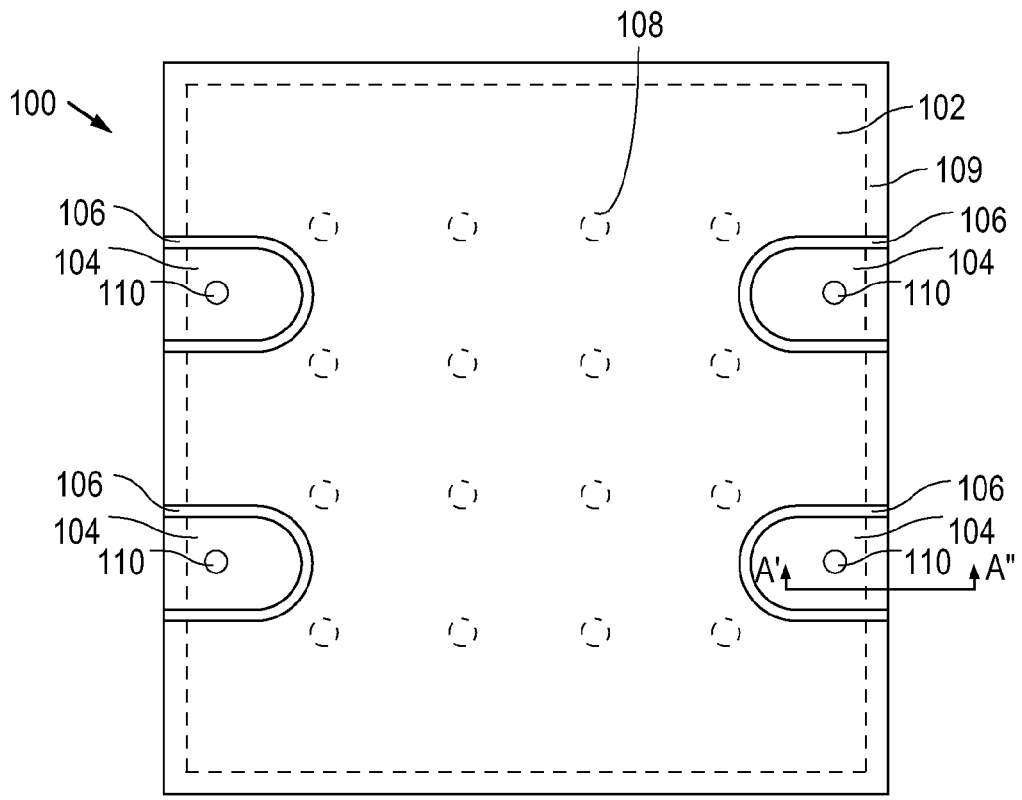
FIG. 1 illustrates a plan view of an LED die that is part of a wafer of LED dies.

FIG. 1 shows a plan view of an LED die 100 in some embodiments of the present disclosure. LED die 100 may be processed wafer scale as part of a device wafer of LED dies (not shown) before it is flipped over, aligned, mounted to a LED submount, and singulated from adjoining LED dies on the wafer. The top side of LED die 100 includes a large n-type bond pad 102 that extends to the four die edges, and four p-type bond pads 104 that each extends to one die edge. N-type bond pad 102 and p-type bond pads 104 are electrically insulated from each other by gaps 106 and an underlying dielectric layer. Also shown in phantom are n-type contacts 108 (only one is labeled) between n-type bond pad 102 and the underlying n-type layer, n-type edge contact 109 at the four die edges and between the n-type bond pad and the underlying n-type layer, and p-type contacts 110 between p-type bond pads 104 and the underlying p-type layer. The number and the geometry of the bond pads and the contacts may vary depending on application.

Figure 2:
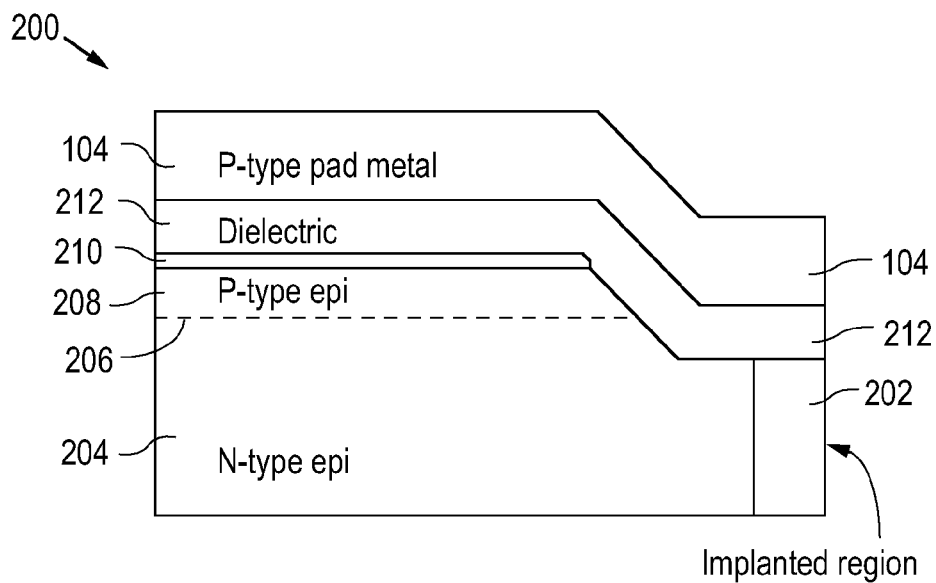
FIG. 2 illustrates a cross-section of the LED die of FIG. 1 with a first structure having one dielectric layer.

FIG. 2 illustrates a structure 200 of LED die 100 in a cross-section along line A'A" (FIG. 1) in some embodiments of the present disclosure. At the die edge, an electrically insulating region 202 is located next to an n-type layer 204 and below a dielectric layer 212 and p-type bond pad 104. LED die 100 include LED layers of n-type layer 204, a light-emitting layer 206 (also commonly referred to as the active region) over the n-type layer, and a p-type layer 208 over the light-emitting layer. A conductive reflective layer 210 is formed over p-type layer 208, dielectric layer 212 is formed over the conductive reflective layer and the exposed LED layers, and p-type bond pad 104 is formed over the dielectric layer. The process for forming LED structure 200 is later described in detail in reference to the flowchart in FIG. 4.

To separate LED die 100 from adjoining LED dies on the device wafer, the LED die is singulated along streets between the dies. During singulation, p-type bond pad 104 may come into contact with electrically insulating region 202. The actual mechanism that causes p-type bond pad 104 to come into contact with electrically insulating region 202 depends on the singulation method. For example, a scribe or a saw may cut into p-type bond pad 104 and deform it into electrically insulating region 202. Alternatively, a laser may cut into p-type bond pad 104 and melt it along the die edge to contact electrically insulating region 202. In any case, without electrically insulating region 202, p-type bond pad 104 may come into contact with n-type layer 204 in its place and create a p-n short that would render LED die 100 defective.

Figure 3:
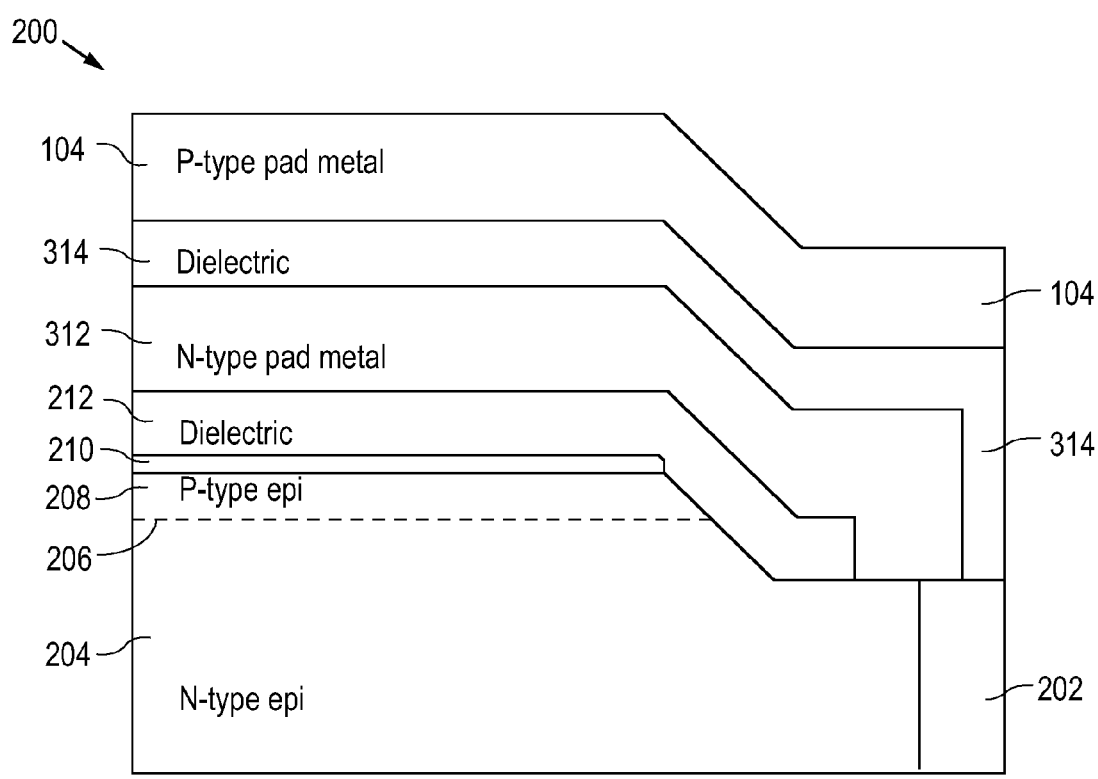
FIG. 3 illustrates a cross-section of the LED die of FIG. 1 with a second structure having two dielectric layer.

FIG. 3 illustrates a structure 300 of LED die 100 in a cross-section along line A'A" (FIG. 1) in some embodiments of the present disclosure. Structure 300 uses two dielectric layers for electrical distribution in contrast to one dielectric layer used by structure 200 (FIG. 2). Layers 204 to 212 are similar to FIG. 2 except that dielectric layer 212 (also referred to as "first dielectric layer 212") does not extend to the die edge. An n-type contact layer 312 is formed over first dielectric layer 212 and on an exposed portion of n-type layer 204 to make an edge contact. A second dielectric layer 314 is formed over n-type contact layer 312 and over electrically insulating region 202, and p-type bond pad 104 is formed over the second dielectric layer. The process for forming LED structure 300 is later described in detail in reference to the flowchart in FIG. 4.

As similarly described above, p-type bond pad 104 may come into contact with electrically insulating region 202 during singulation. Without electrically insulating region 202, p-type bond pad 104 may come into contact with n-type layer 204 in its place and create a p-n short that would render LED die 100 defective.

Figure 4:
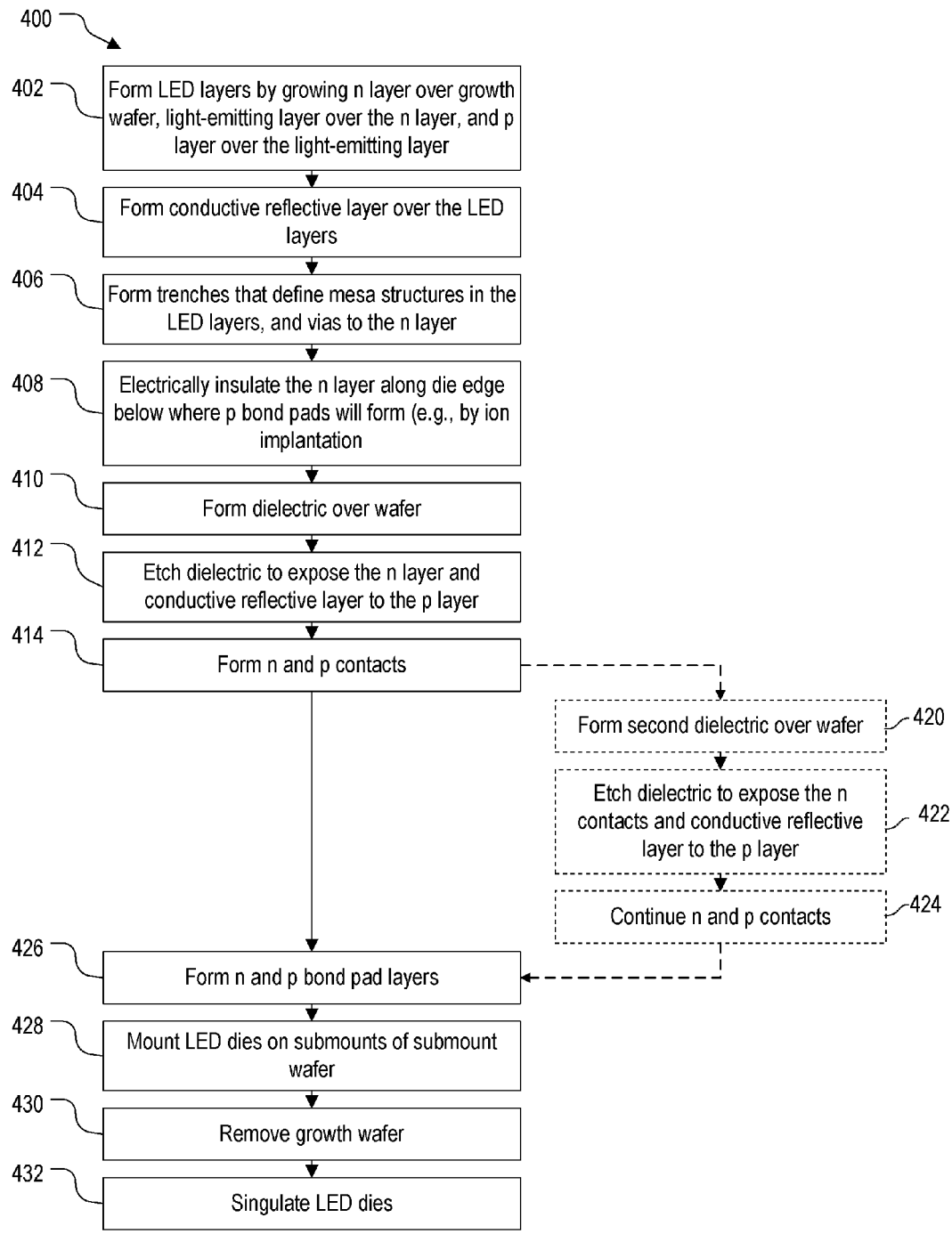
FIG. 4 is a flowchart of a method to form the LED of FIG. 1 with the structure of FIG. 2 or 3.

FIG. 4 is a flowchart of a method 400 for forming LED die 100 in some embodiments of the present disclosure. Method 400 includes processes 402 to 414 and 426 to 432 for forming structure 200 (FIG. 2), and further includes optional processes 420 to 424 for forming structure 300 (FIG. 3).

Figure 5:
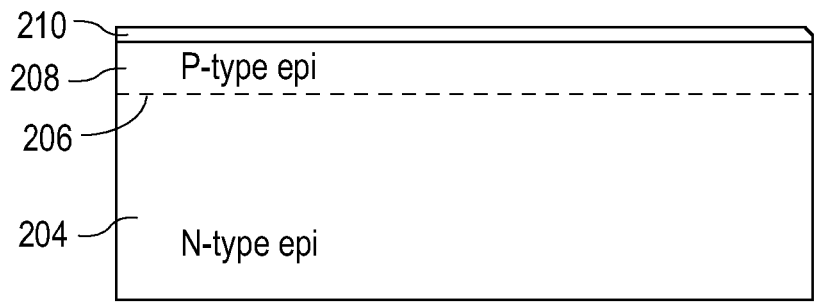
FIGS. 5 to 8 illustrate the processes to form the LED die of FIG. 1 with the structure of FIG. 2 or 3.

In process 402, LED layers are formed over a growth wafer. Referring to FIG. 5, n-type layer 204 is epitaxially grown over a sapphire growth wafer (not shown). N-type layer 204 represents multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n-type device layers designed for particular optical or electrical properties desirable for a light-emitting layer to efficiently emit light. The n-type device layers in a III-nitride light emitting device may be GaN.

Light-emitting layer 206 is epitaxially grown over n-type layer 204. Light-emitting layer 206 may be represented by multiple thin quantum well light-emitting layers separated by barrier layers. In a III-nitride light emitting device configured to emit visible light, in particular near-UV through green light, the light-emitting layer may be InGaN.

P-type layer 208 is epitaxially grown over light-emitting layer 206. P-type layer 208 represents multiple layers of different composition, thickness, and dopant concentration, including p-type device layers. The p-type device layers in a III-nitride light emitting device may be GaN. Process 402 is followed by process 404.

In process 404, conductive reflective layer 210 is formed over the LED layers as shown in FIG. 5. Conductive reflective layer 210 represents multiple layers including an ohmic contact layer, a reflective layer, and a guard metal layer. The ohmic contact layer may be Ni, Ag, or Pd, the reflective layer may be Ag, and the guard metal layer may be multiple layers including TiW/TiW:N/TiW. Conductive reflective layer 210 may be patterned by a lift-off process. Process 404 is followed by process 406.

Figure 6:
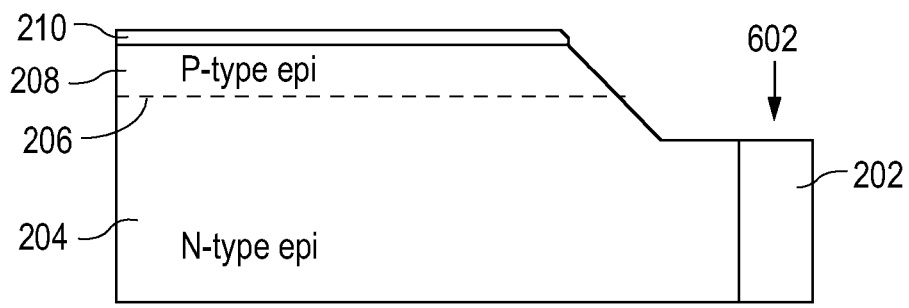

In process 406, trenches 602 (only one is shown in the cross-section) are formed on the wafer along the singulation streets between the LED dies to define mesa structures as shown in FIG. 6. Trenches 602 reach partially into n-type layer 204 to expose the n-type layer along the die edge so it may later make edge contact with an n-type contact layer. Although not shown, vias to n-type layer 204 are also formed at the same time as trenches 602. Trenches 602 and the vias may be formed by etching. Process 406 is followed by process 408.

Figure 7:
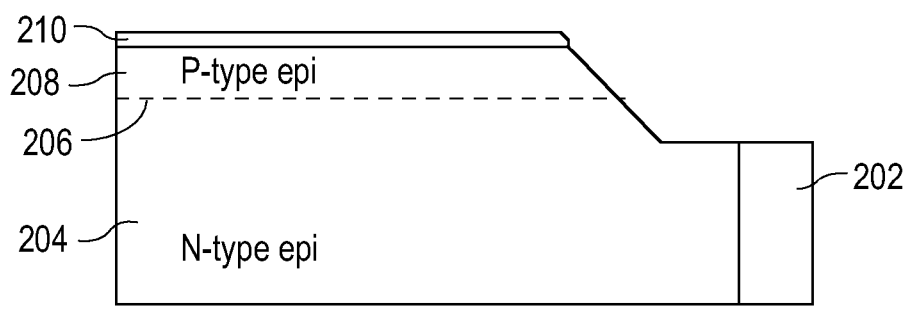

In process 408, portions of n-type layer 204 are electrically insulated along the die edge under where p-type bond pads 104 are to be formed. As a result, electrically insulating regions 202 are formed as shown in FIG. 7. Electrically insulating regions 202 are formed by masking to define implant areas followed by ion implantation. The energy for the implantation may be greater than 100 keV and the implant species may be He, Zn, Mg, or Al. Process 408 is followed by process 410.

Figure 8:
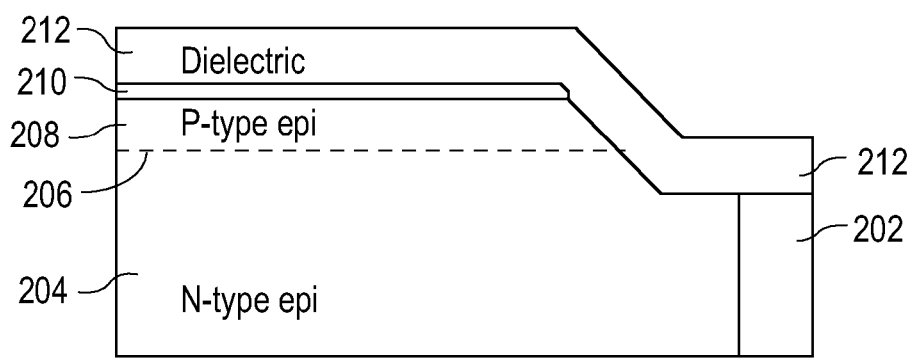

In process 410, dielectric layer 212 is deposited over the device wafer as shown in FIG. 8. Dielectric layer 212 may be SiNx. Process 410 is followed by process 412.

In process 412, dielectric layer 212 is patterned to provide access to n-type layer 204 and conductive reflective layer 214 to p-type layer 208. Portions of dielectric layer 212 along the die edge where edge contacts are to be made are removed to expose n-type layer 204. Portions of dielectric layer 212 over the bottom of the vias are removed to expose n-type layer 204. Holes for p-type contacts 110 (FIG. 1) are formed in dielectric layer 212 over conductive reflective layer 210 where p-type bond pads 104 are to be formed. Dielectric layer 212 may be patterned by etching. Process 412 is followed by process 414.

In process 414, a contact metal layer (e.g., interconnects) is deposited over the device wafer to form the n-type contacts 108 that fill in the vias, the n-type edge contacts 109 around the die edge, and p-type contacts 110 as shown in FIG. 1. The contact metal layer is patterned to electrically insulate the n-type and the p-type contacts. The contact metal layer may be Ti/Au or Al. The contact metal layer may be formed by a lift-off process. Process 414 is followed by process 426.

In process 426, bond metal layers are formed over the device wafer (FIG. 2 only shows a p-type bond metal layer). N-type and p-type bond metal layers are electrically coupled to respective n-type and p-type contacts formed in process 414. The n-type and the p-type bond metal layers extend over the singulation streets between the LED dies. After singulation in later described process 432, the bond metal layers become n-type bond pad 102 and p-type bond pads 104 of each LED die as shown in FIG. 1. The bond metal layer may be Au, Cu, Al, Ni, or a combination of those layers. The bond metal layer may be formed electro-chemically (e.g., electroplating) or by other physical deposition method (e.g., evaporation or sputtering). Process 426 is followed by process 428.

For more information related to processes 410, 412, 414, and 426, please refer to U.S. patent application Ser. No. 11/611,775, entitled "LED Assembly Having Maximum Metal Support for Laser Lift-off of Growth Substrate," filed on Dec. 15, 2006, which is commonly assigned and incorporated by reference.

In process 428, the LED dies on the device wafer are flipped over, aligned, and bonded to LED submounts on an LED submount wafer. The LED dies may be bonded to the LED submounts by ultrasonic or thermosonic bonding. The LED submounts provide mechanical support, electrical distribution, and thermal dissipation for the LED dies. Process 428 is followed by process 430.

In process 430, the growth substrate is removed. The growth substrate may be removed by laser lift-off. Process 430 is followed by process 432.

In process 432, the LED dies are singulated. The LED dies may be separated by a laser, a scribe, or a saw along the singulation streets between the dies. Once singulated, the bond metal layers become n-type bond pads 102 and p-type bond pads 104 for the LED dies. Bond pads 102 and 104 of each LED may cover at least 85% of the surface of the LED die that faces the submount.

Method 400 may be modified to form structure 300 in some embodiments of the present disclosure. In these embodiments, process 414 is followed by alternative process 420.

In optional process 420, a second dielectric layer 314 is deposited over the wafer as shown in FIG. 3. Dielectric layer 314 may be SiNx. Optional process 420 is followed by optional process 422.

In optional process 422, dielectric layer 314 is patterned to provide access to n-type contacts 108, n-type edge contact 109, and conductive reflective layer 214 formed in process 414. For access to conductive reflective layer 214, holes for p-type contacts 110 (FIG. 1) are formed in dielectric layer 212 over conductive reflective layer 210 where p-type bond pads 104 are to be formed. Dielectric layer 212 is patterned by etching. Optional process 422 is followed by optional process 424.

In optional process 424, another contact metal layer (e.g., interconnects) is formed over the wafer to continue n-type contacts 108, n-type edge contact 109, and p-type contacts 110. The contact metal layer is then patterned to electrically insulate the n-type and the p-type contacts. The contact metal layer may be Ti/Au or Al. The contact metal layer may be formed by a lift-off process. Optional process 424 is followed by process 426 described above and results in structure 300 shown in FIG. 3.

For more information related to processes 410, 412, 414, 420, 422, and 424, please refer to U.S. Pat. No. 6,828,596, which is commonly assigned and incorporated herein by reference.

Figure 9:
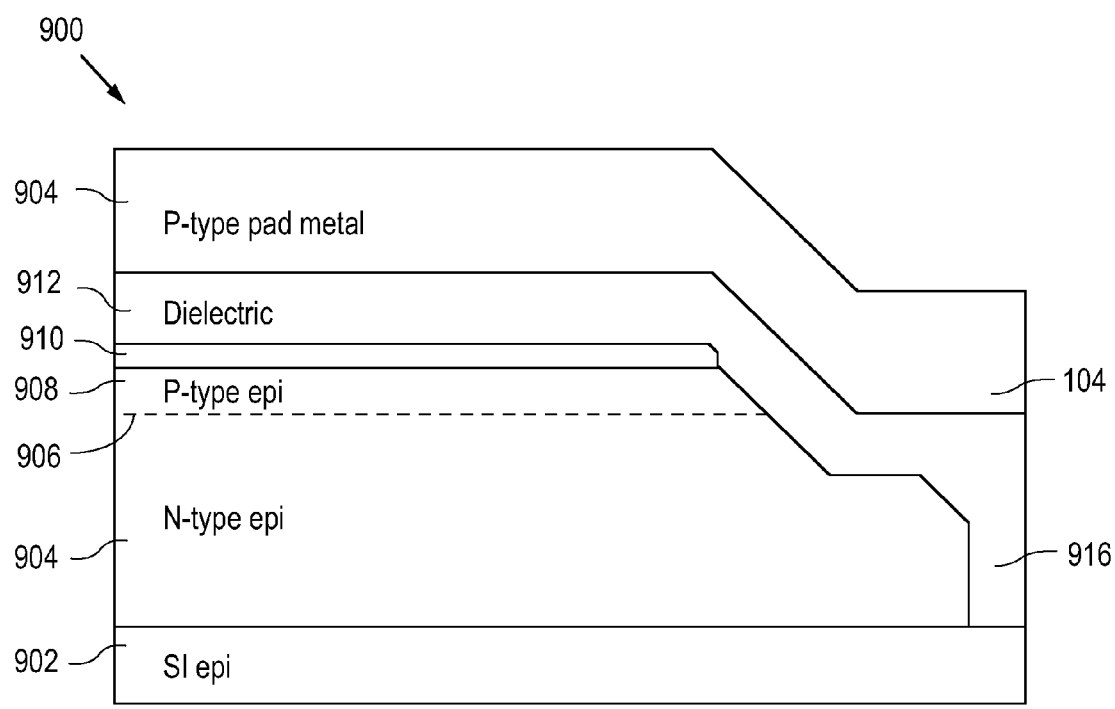
FIG. 9 illustrates a cross-section of the LED die of FIG. 1 with a third structure having a semi-insulating epitaxial layer.

FIG. 9 illustrates a structure 900 of LED die 100 in a cross-section along line A'A" (FIG. 1) in some embodiments of the present disclosure. Structure 900 includes a semi-insulating layer 902 and LED layers over the semi-insulating layer. The LED layers include an n-type layer 904 over the semi-insulating layer, a light-emitting layer 906 over the n-type layer, and a p-type layer 908 over the light-emitting layer. While semi-insulating layer 902 extends to the die edge, n-type layer 904 does not extend to the die edge. A conductive reflective layer 910 is formed over p-type layer 908. A dielectric layer 912 is formed over conductive reflective layer 910, the exposed LED layers, and the exposed semi-insulating layer 904. P-type bond pad 104 is formed over dielectric layer 912. The process for forming LED structure 900 is later described in detail in reference to the flowchart in FIG. 10.

The presence of semi-insulating layer 902 allows n-type layer 904 to be recessed back from the die edge and then electrically insulated along the die edge with dielectric layer 912. In other words, dielectric layer 912 forms electrically insulating regions 916 (only one is shown in the cross-section) next to portions of n-type layer 904 and under where p-type bond pads 104 will extend to the die edge. Electrically insulating regions 916 prevent p-type bond pads 104 from contacting n-type layer 904 and create a p-n short during singulation.

Figure 10:
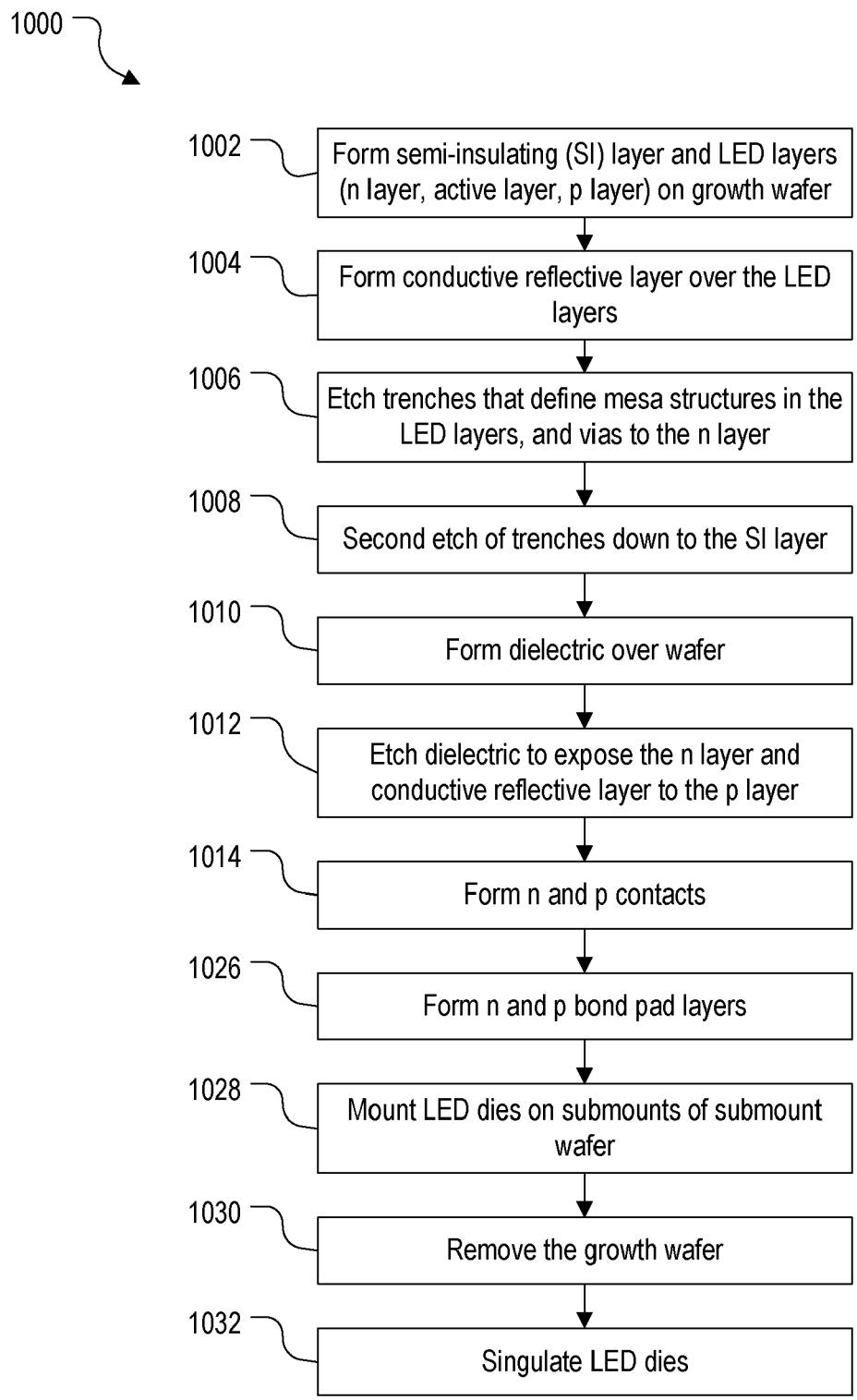
FIG. 10 is a flowchart of a method to form the LED of FIG. 1 with the structure of FIG. 9.

FIG. 10 is a flowchart of a method 1000 for forming LED die 100 with structure 900 in some embodiments of the present disclosure. Method 1000 includes processes 1002 to 1014 and 1026 to 1032.

Figure 11:
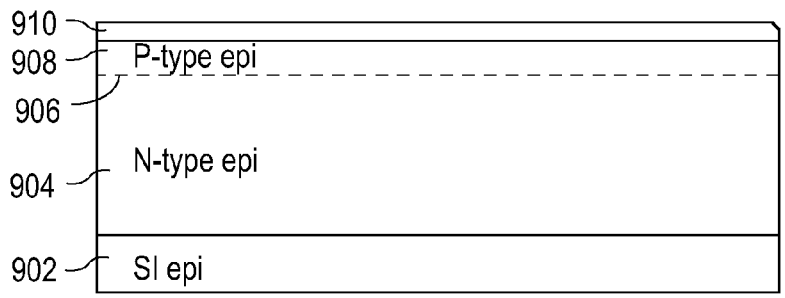
FIGS. 11 to 14 illustrate the processes to form the LED die of FIG. 1 with the structure of FIG. 9, all arranged in accordance with embodiments of the invention.

In process 1002, semi-insulating layer 902 is formed over a growth wafer, and LED layers are formed over the semi-insulating layer. Referring to FIG. 11, semi-insulating layer 902 is epitaxially grown over a sapphire growth substrate (not shown). Semi-insulating layer 902 in a III-nitride light emitting device may be GaN, and it may be p-type, n-type, codoped, or undoped. Semi-insulating layer 902 may be formed by ion implantation with an approximate dose and energy of 8E13 $cm^{-2}$ and 400 keV, respectively, for a 4 micron thick epitaxial layer. Implantation species may be He, Zn, Al, or Mg.

Semi-insulating layer 902 may be doped with deep level impurities such as Fe, C, Co, Mn, Cr, V, Ni, and/or other transition metal dopants by ion implantation or during epitaxial growth. A deep level dopant may be used in combination with a shallow level dopant such as Si, Ge, O, Mg, or Zn at a concentration less than about $1 \times 10^{17}$ $cm^{-3}$. The deep level impurity may have a concentration greater than about $1 \times 10^{17}$ $cm^{-3}$.

N-type layer 904 is epitaxially grown over semi-insulating layer 902. N-type layer 904 represents multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n-type device layers designed for particular optical or electrical properties desirable for the light-emitting layer to efficiently emit light. The n-type device layers in a III-nitride light emitting device may be GaN.

Light-emitting layer 906 is epitaxially grown over n-type layer 904. Light-emitting layer 906 may be represented by multiple thin quantum well light emitting-layers separated by barrier layers. In a III-nitride light emitting device configured to emit visible light, in particular near-UV through green light, the light-emitting layer may be InGaN.

P-type layer 908 is epitaxially grown over light-emitting layer 906. P-type layer 208 represents multiple layers of different composition, thickness, and dopant concentration, including p-type device layers. The p-type device layers in a III-nitride light emitting device may be GaN. Process 1002 is followed by process 1004.

In process 1004, a conductive reflective layer 910 is formed over the LED layers as shown in FIG. 11. Conductive reflective layer 910 represents multiple layers including an ohmic contact layer, a reflective layer, and a guard metal layer. The ohmic contact layer may be Ni, Ag, or Pd, the reflective layer may be Ag, and the guard metal layer may be multiple layers including TiW/TiW:N/TiW. Conductive reflective layer 910 may be patterned by a lift-off process. Process 1004 is followed by process 1006.

Figure 12:
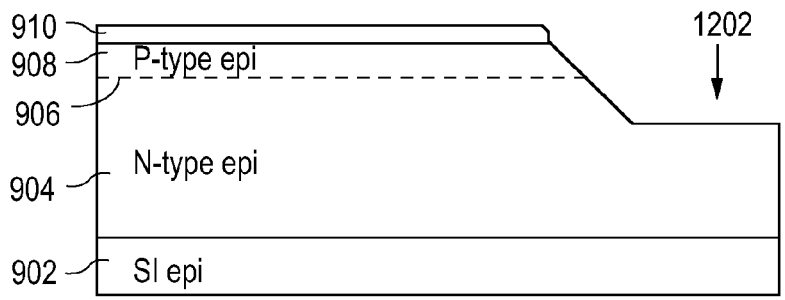

In process 1006, trenches 1202 (only one is shown in the cross-section) are etched on the wafer along the streets between the LED dies to define mesa structures as shown in FIG. 12. Trenches 1202 reach partially into n-type layer 904 to expose the n-type layer along the die edge so it may later make edge contact with an n-type contact layer. Although not shown, vias to n-type layer 904 are also formed at the same time as trenches 1202. Trenches 1202 and the vias may be formed by etching. Process 1006 is followed by process 1008.

Figure 13:
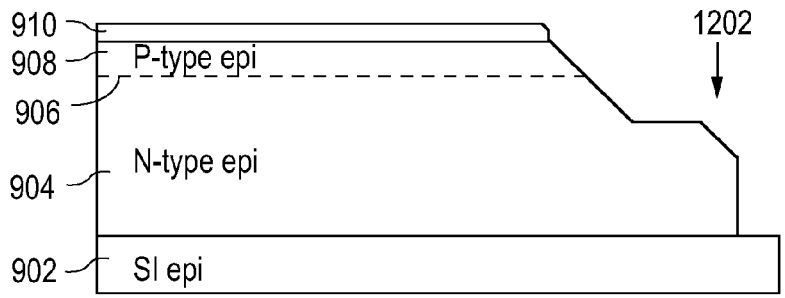

In process 1008, trenches 1202 are etched a second time down to semi-insulating layer 902 along the die edge under where p-type bond pads 104 will extend to the die edge as shown in FIG. 13. N-type layer 904 is now etched back from the die edge. Process 1008 is followed by process 1010.

Figure 14:
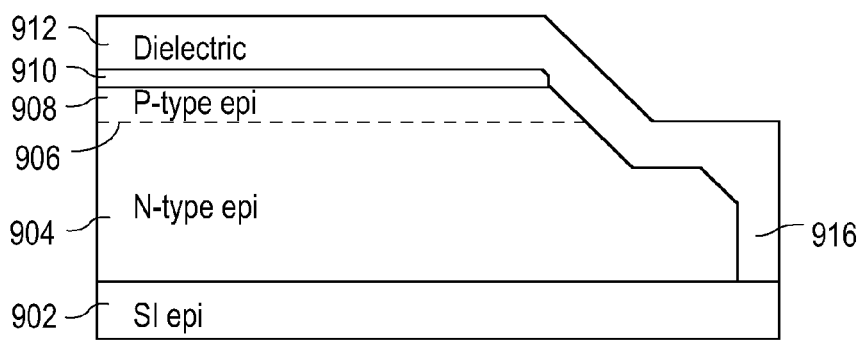

In process 1010, dielectric layer 912 is deposited over the wafer as shown in FIG. 14. Dielectric layer 912 covers portions of the exposed vertical edge of n-type layer 904 and forms electrical insulating regions 916. Dielectric layer 212 may be SiNx. Process 1010 is followed by process 1012.

In process 1012, dielectric layer 912 is patterned to provide access to n-type layer 904 and conductive reflective layer 910 to p-type layer 908. Portions of dielectric layer 912 along the die edge where edge contacts are to be made are removed to expose n-type layer 904. Portions of dielectric layer 912 over the bottom of the vias are removed to expose n-type layer 904. Holes for p-type contacts 110 (FIG. 1) are formed in dielectric layer 912 over conductive reflective layer 910 where p-type bond pads 104 are to be formed. Dielectric layer 912 may be patterned by etching. Process 1012 is followed by process 1014.

In process 1014, a contact metal layer (e.g., interconnects) is deposited over the device wafer to form the n-type contacts 108 that fill in the vias, the n-type edge contact 109 around the die edge, and p-type contacts 110 as shown in FIG. 1. The contact metal layer is patterned to electrically insulate the n-type and the p-type contacts. The contact metal layer may be Ti/Au or Al. The contact metal layer may be formed by a lift-off process. Process 1014 is followed by process 1026.

In process 1026, bond metal layers are formed over the device wafer as shown in FIG. 9. N-type and p-type bond metal layers are electrically coupled to respective n-type and p-type contacts formed in process 1014. The n-type and the p-type bond metal layers extend over the singulation streets between the LED dies. After singulation in later described process 1032, the bond metal layers become n-type bond pad 102 and p-type bond pads 104 of each LED die as shown in FIG. 1. The bond metal layer may be Au, Cu, Al, Ni, or a combination of those layers. The bond metal layer may be formed electro-chemically (e.g., electro-plating) or by other physical deposition method (e.g., evaporation or sputtering). Process 1026 is followed by process 1028.

For more information related to processes 1010, 1012, 1014, and 1026, please refer to U.S. patent application Ser. No. 11/611,775, entitled "LED Assembly Having Maximum Metal Support for Laser Lift-off of Growth Substrate," filed on Dec. 15, 2006, which is commonly assigned and incorporated by reference.

In process 1028, LED dies on the device wafer are flipped over, aligned, and bonded to LED submounts on an LED submount wafer. The LED dies may be bonded to the LED submounts by ultrasonic or thermionic bonding. The LED submounts provide mechanical support, electrical distribution, and thermal dissipation for the LED dies. Process 1028 is followed by process 1030.

In process 1030, the growth substrate is removed. The growth substrate may be removed by laser lift-off. Process 1030 is followed by process 1032.

In process 1032, the LED dies are singulated. The LED dies may be separated by a laser, a scribe, or a saw along the singulation streets between the dies. Once singulated, the bond metal layers become n-type bond pads 102 and p-type bond pads 104 for the LED dies. Bond pads 102 and 104 of each LED may cover at least 85% of the surface of the LED die that faces the submount.

Various other adaptations and combinations of features of the embodiments disclosed are within the scope of the invention. Although a GaN based LED with a sapphire growth substrate is described, other types of LEDs using other substrates such as SiC (used to form an InAlGaN LED) and GaAs (used to form an AlInGaP LED) may benefit from the present disclosure. Although the n-type, the light-emitting, and the p-type layers are arranged in a specific orientation, the order may be reversed in other embodiments. Numerous embodiments are encompassed by the following claims.

What is claimed is:

1. A method for fabricating a light emitting diode (LED) structure, comprising:
    forming LED layers by epitaxially growing a first conductivity type layer over a growth wafer, a light-emitting layer over the first conductivity type layer, and a second conductivity type layer over the light-emitting layer;
    forming trenches along die edges to expose the first conductivity type layer at the die edges, the trenches reaching at least partially into the first conductivity type layer, the trenches forming mesa structures of LED dies;
    electrically insulating regions of the exposed first conductivity type layer at the die edges by forming electrically insulating regions at the die edges; and
    forming first conductivity type and second conductivity type bond pad layers over the LED dies, the first conductivity type and the second conductivity type bond pad layers extending over singulation streets between the LED dies, the first conductivity type and the second conductivity type bond pad layers being electrically coupled to the first conductivity type and the second conductivity type layers, respectively.

2. The method of claim 1, wherein electrically insulating the regions of the exposed first conductivity type layer at the die edges comprises implanting ions into the regions of the exposed first conductivity type layer at the die edges to form the electrically insulating regions.

3. The method of claim 1, further comprising:
    epitaxially growing a semi-insulating layer over the growth substrate before forming the LED layers, wherein:
        the LED layers are formed over the semi-insulating layer;

forming trenches along the die edges to expose the first conductivity type layer at the die edges comprises performing a first etch of the LED layers down at least partially into the first conductivity type layer and performing a second etch of the LED layers down to the semi-insulating epitaxial layer; and electrically insulating the regions of the exposed first conductivity type layer at the die edges comprises forming a dielectric layer over the LED layers, wherein the electrically insulating regions comprise the dielectric layer over the regions of the exposed first conductivity type layer at the die edges.

4. The method of claim 1, further comprising:
mounting the LED dies to submounts on a submount wafer;
removing the growth wafer from LED dies; and
singulating the LED dies along the singulation streets, wherein the first conductivity type and the second conductivity type bond pad layers are respectively divided into first conductivity type bond pads and second conductivity type bond pads of the LED dies during singulation, the first conductivity type and the second conductivity type bond pads being electrically coupled to the first conductivity type and the second conductivity type layers, respectively.

5. The method of claim 4, wherein one or more portions of the second conductivity type bond pads are deformed into the electrically insulating regions without contacting the first conductivity type layer during singulation.

6. The method of claim 4, wherein the first conductivity type and the second conductivity type bond pads are electrically insulated by gaps and an underlying dielectric layer, and the first conductivity type and the second conductivity type bond pads of each LED die cover at least 85% of a surface of the LED die that faces a submount.

7. The method of claim 4, further comprising:
forming a dielectric layer over the LED layers, wherein the first conductivity type and the second conductivity type bond pad layers are formed over the dielectric layer.

8. The method of claim 4, further comprising:
forming a first dielectric layer over the LED layers;
forming interconnects over the first dielectric layer, the interconnects being electrically coupled to the first conductivity type layer and the second conductivity type layer; and
forming a second dielectric layer over the first dielectric layer and the interconnects, wherein the first conductivity type and the second conductivity type bond pad layers are electrically coupled by the interconnects to the first conductivity type and the second conductivity type layers.

9. A light emitting diode (LED) die, comprising:
LED layers comprising a first conductivity type layer, a light-emitting layer over the first conductivity type layer, and a second conductivity type layer over the light-emitting layer;
one or more electrically insulating regions laterally adjacent to the first conductivity type layer and along one or more die edges;
a first conductivity type bond pad electrically coupled to the first conductivity type layer, the first conductivity type bond pad extending to the die edges; and
one or more second conductivity type bond pads electrically coupled to the second conductivity type layer, the second conductivity type bond pads extending to the die edges and over the electrically insulating region.

10. The LED die of claim 9, wherein the electrically insulating regions comprise ion implanted regions of the first conductivity type layer.

11. The LED die of claim 9, wherein the electrically insulating regions comprise a resistively grown epitaxial layer.

12. The LED die of claim 9, further comprising:
a semi-insulating layer, wherein the LED layers are formed over the semi-insulating layer;
regions of the first conductivity type layer exposed at the die edges down to the semi-insulating epitaxial layer; and
a dielectric layer over the LED layers, wherein the electrically insulating regions comprise the dielectric layer over the regions of the first conductivity type layer exposed at the die edges.

13. The LED die of claim 9, wherein the second conductivity type bond pads deform into the electrically insulating regions, which prevent the second conductivity type bond pads from contacting the first conductivity type layer.

14. The LED die of claim 9, wherein the first conductivity type and the second conductivity type bond pads are electrical insulated by gaps and an underlying dielectric layer, and the first conductivity type and the second conductivity type bond pads cover at least 85% of a surface of the LED die that faces a submount.

15. The LED die of claim 9, further comprising:
a dielectric layer over the LED layers, wherein the first conductivity type and the second conductivity type bond pad layers are formed over the dielectric layer.

16. The LED die of claim 9, wherein the LED structure further comprise:
a first dielectric layer over the LED layers;
interconnects over the first dielectric layer, the interconnects being electrically coupled to the first conductivity type layer and the second conductivity type layer; and
a second dielectric layer over the first dielectric layer and the interconnects, wherein the first conductivity type and the second conductivity type bond pads are electrically coupled by the interconnects to the first conductivity type and the second conductivity type layers.

* * * * *